United States Patent
Han et al.

(10) Patent No.: US 9,698,738 B2
(45) Date of Patent: Jul. 4, 2017

(54) BANDPASS FILTER PROVIDING WIDE GAIN CONTROL RANGE

(71) Applicant: ELECTRONICS AND TELECOMMUNICATIONS RESEARCH INSTITUTE, Daejeon (KR)

(72) Inventors: Seon-Ho Han, Daejeon (KR); Cheon-Soo Kim, Daejeon (KR); Nam Nguyen Hoai, Daejeon (KR); Ki-Su Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/004,474

(22) Filed: Jan. 22, 2016

(65) Prior Publication Data

US 2016/0241214 A1    Aug. 18, 2016

(30) Foreign Application Priority Data

Feb. 13, 2015   (KR) .................. 10-2015-0022651

(51) Int. Cl.
| | |
|---|---|
| H03F 1/32 | (2006.01) |
| H03H 11/04 | (2006.01) |
| H03F 3/193 | (2006.01) |
| H03F 3/45 | (2006.01) |
| H03G 5/28 | (2006.01) |

(52) U.S. Cl.
CPC ......... *H03F 1/3241* (2013.01); *H03F 1/3211* (2013.01); *H03F 3/193* (2013.01);
(Continued)

(58) Field of Classification Search
CPC .............. H03H 11/0422; H03H 11/04; H03H 11/1291; H03H 11/1213; H03K 5/1252
(Continued)

(56) References Cited

U.S. PATENT DOCUMENTS 6,690,232 B2 *  2/2004  Ueno ................. H03G 9/16
                                                          330/141
6,791,401 B2 *  9/2004  Miwa ............. H03H 11/0433
                                                          327/552
(Continued)

FOREIGN PATENT DOCUMENTS

| KR | 10-2003-0048046 A | 6/2003 |
|---|---|---|
| KR | 10-2005-0064485 A | 6/2005 |
| WO | WO 02/23723 A1 | 3/2002 |

OTHER PUBLICATIONS

Milad Darvishi, et al., "Widely Tunable 4th Order Switched $G_m$-C Band-Pass Filter Based on N-Path Filters," IEEE Journal of Solid-State Circuits, Dec. 2012, pp. 3105-3119, vol. 47, No. 12, IEEE.
(Continued)

*Primary Examiner* — Dinh T Le

(57) ABSTRACT

A bandpass filter that provides a wide gain control range is provided. The bandpass filter performs channel filtering and gain control while maintaining the bandpass characteristic of the bandpass filter. The bandpass filter enables gain control for a wide signal amplitude range while maintaining performance characteristics, such as an out-of-band attenuation ratio capable of high linearity and good pass-band flatness.

9 Claims, 15 Drawing Sheets

(52) U.S. Cl.
CPC ..... *H03F 3/45179* (2013.01); *H03F 3/45475* (2013.01); *H03G 5/28* (2013.01); *H03H 11/0466* (2013.01); *H03H 11/0472* (2013.01); *H03F 2200/451* (2013.01)

(58) Field of Classification Search
USPC .......................................... 327/551–559, 317
See application file for complete search history.

(56) References Cited

U.S. PATENT DOCUMENTS

| 8,149,052 | B2* | 4/2012 | Huang | ................ | H03D 7/1441 |
|---|---|---|---|---|---|
| | | | | | 330/149 |
| 9,130,622 | B2* | 9/2015 | Montalvo | ............ | H04B 1/0475 |
| | | | | | 375/296 |
| 2009/0251618 | A1 | 10/2009 | Gao et al. | | |
| 2013/0177107 | A1 | 7/2013 | Seo et al. | | |
| 2013/0293318 | A1 | 11/2013 | Hong et al. | | |
| 2013/0335163 | A1 | 12/2013 | Aggarwal et al. | | |
| 2013/0336342 | A1 | 12/2013 | Aggarwal | | |

OTHER PUBLICATIONS

Milad Darvishi, et al., "A 0.1-to-1.2GHz Tunable 6th-Order N-Path Channel-Select Filter with 0.6dB Passband Ripple and +7dBm Blocker Tolerance", 2013 IEEE International Solid-State Circuits Conference, Feb. 19, 2013, pp. 172-174, IEEE.

* cited by examiner

BANDPASS FILTER PROVIDING WIDE GAIN CONTROL RANGE

CROSS REFERENCE TO RELATED APPLICATION

This application claims the benefit of Korean Patent Application No. 10-2015-0022651, filed Feb. 13, 2015, which is hereby incorporated by reference in its entirety into this application.

BACKGROUND OF THE INVENTION

1. Technical Field

The following embodiment relates generally to a bandpass filter, and more particularly to a bandpass filter that provides a wide range of gain control.

2. Description of the Related Art

A switched gmC N-path bandpass filter may automatically vary the signal pass-band of a bandpass filter by varying an input clock frequency. The switched gmC N-path bandpass filter has a structure suitable for processing a narrow-band signal over a wide frequency band, and has been recently developed.

However, the switched gmC N-path bandpass filter has some technical problems when applied to a high-performance communication receiver. In detail, it is difficult to impart the existing switched gmC N-path bandpass filter with a constant transfer characteristic in gain control due to the characteristics of circuit implementation, and thus a gain control function has not been implemented for input signals having a wide amplitude range.

The gain control function is an essential function because a receiver processes input signals within a wide signal amplitude range. When the gain control function is added in the switched gmC N-path bandpass filter, the linearity of the bandpass filter may be greatly decreased by distortion of the transfer characteristic of the filter, according to the method of implementation of the added gain control function. This is because the characteristic of the switched gmC N-path bandpass filter is changed in conjunction with gain control when the switched gmC N-path bandpass filter itself has the gain control function due to the change of the internal circuit of the switched gmC N-path bandpass filter. Therefore, it is difficult to precisely control the required gain depending on the change of the characteristic.

The Korean Patent Application Publication No. 10-2003-0048046 (disclosed on Jun. 18, 2003) disclosed a GmC filter for suppressing unwanted signals generated by a GmC compression stage.

SUMMARY OF THE INVENTION

An embodiment may provide a bandpass filter that provides gain control for a wide input signal amplitude range.

An embodiment may provide a transmitter and receiver that provide gain control for a wide input signal amplitude range.

An embodiment may provide a bandpass filter that maintains the transfer characteristic of the filter while providing gain control.

An embodiment may provide a bandpass filter that enables gain control for a wide input signal amplitude range while maintaining performance, such as an out-of-band attenuation ratio capable of high linearity, and better pass-band flatness.

In one aspect, provided is a bandpass filter including: a first resonator for performing filtering of an input signal; and a gain control unit for performing gain control between a voltage of an input signal of the bandpass filter and a current of an output signal of the bandpass filter. The gain control unit performs pre-distortion corresponding to a transfer characteristic of the bandpass filter.

The transfer characteristic may include at least one of a flatness factor of the filter and a Q factor of the filter.

The gain control unit may include a predistorter for compensating for a decrease in a quality factor according to the gain control of the gain control unit.

The gain control unit may further include a first transconductance circuit (Gm) for changing a gm value for the gain control.

The predistorter may attenuate the input signal in phases to correspond to a step of the gain control of the first resonator and the first Gm.

The gain control unit may further include a main Gm and a feedforward negative Gm.

Outputs of the main Gm and outputs of the feedforward negative Gm may be connected to each other.

The feedforward negative Gm may control gain by the gain control unit by outputting a signal having a polarity reverse to that of the main Gm.

The bandpass filter may further include a second resonator and a third resonator, for performing bandpass filtering and bandwidth extension.

The bandpass filter may further include a gyrator for connecting the gain control unit, the second resonator, and the third resonator to each other.

The bandpass filter may further include at least one negative feedback impedance element for correcting the transfer characteristic of the bandpass filter.

A negative Gm for improving a Q factor of the bandpass filter may be attached to both ends of the gyrator.

The bandpass filter may further include a common mode feedback circuit, connected to both terminals of the output signal.

The gain control unit may include an inverter-based Gm for converting a voltage of an input signal to a current of an output signal; a pre-distortion MOS array for performing gain control and differential pre-distortion; and an output current driving MOS array for driving an output signal having a polarity reverse to that of the input signal.

In another aspect, provided is a switched N-path bandpass filter including: a first switched capacitor for performing filtering of an input signal; and a gain control unit for performing gain control between a voltage of an input signal of the bandpass filter and a current of an output signal of the bandpass filter. The gain control unit performs pre-distortion corresponding to a transfer characteristic of the bandpass filter.

The transfer characteristic may include at least one of a flatness factor of the filter and a Q factor of the filter.

The gain control unit may include a predistorter for compensating for a decrease in a quality factor according to the gain control of the gain control unit.

The gain control unit may further include a main Gm and a feedforward negative Gm.

Outputs of the main Gm and outputs of the feedforward negative Gm are connected to each other, and the feedforward negative Gm may control gain by the gain control unit by outputting a signal having a polarity reverse to that of the main Gm.

The switched N-path bandpass filter may further include a second switched capacitor and a third switched capacitor, for performing bandpass filtering and bandwidth extension.

The switched N-path bandpass filter may further include a gyrator for connecting the gain control unit, the second switched capacitor, and the third switched capacitor to each other.

The switched N-path bandpass filter may further include at least one negative feedback impedance element for correcting the transfer characteristic of the bandpass filter.

A negative Gm for improving a Q factor of the switched N-path bandpass filter may be attached to the gyrator.

The switched N-path bandpass filter may further include a common mode feedback circuit, connected to both terminals of the output signal.

The gain control unit may include: an inverter-based Gm for converting a voltage of an input signal to a current of an output signal; a pre-distortion MOS array for performing gain control and differential pre-distortion; and an output current driving MOS array for driving an output signal having a polarity reverse to that of the input signal.

In a further aspect, provided is a Gm including: an inverter-based Gm for converting a voltage of an input signal to a current of an output signal; a pre-distortion MOS array for performing gain control and differential pre-distortion; and an output current driving MOS array for driving an output signal having a polarity reverse to that of the input signal.

BRIEF DESCRIPTION OF THE DRAWINGS

The above and other objects, features and advantages of the present invention will be more clearly understood from the following detailed description taken in conjunction with the accompanying drawings, in which:

FIG. 1A illustrates a characteristic of a filter having a high-quality factor according to an embodiment;

FIG. 1B illustrates a characteristic of a filter of which a bandpass characteristic is worsed, according to an embodiment;

FIG. 1C illustrates a filter characteristic in which the transfer characteristics of the narrow bandpass filters are overlapped parallel to the frequency axis;

DESCRIPTION OF THE PREFERRED EMBODIMENTS

Figure 1A:
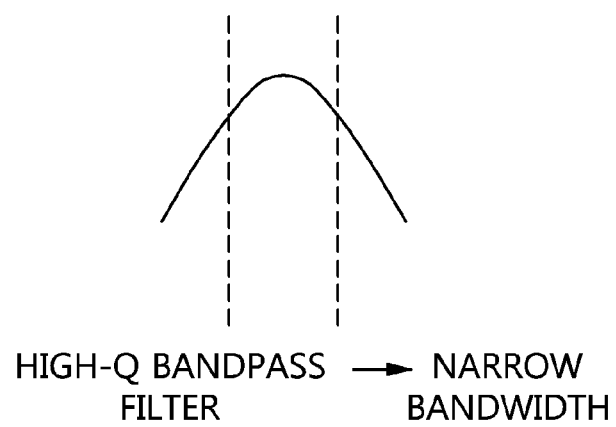
FIGS. 1A to 1C illustrate an implementation characteristic of a bandpass filter according to an embodiment.

Specific embodiments will be described in detail below with reference to the attached drawings. It should be understood that the embodiments are different from each other, but the embodiments do not need to be exclusive of each other. Terms used in the specification should not be construed as being limited to ordinary meanings or dictionary definitions, and may be interpreted based on practical meanings of the terms and the present specification. It will be understood that when an element is referred to as being "connected" or "coupled" to another element, it can be directly connected or coupled to the other element, or intervening elements may be present. In the following description of the present invention, the same reference numerals are used to designate the same or similar elements throughout the drawings.

Hereinafter, the term "Gm" may be an abbreviation of transconductance, and may indicate a transconductance circuit. Also, the term "Gm" may indicate a transconductance amplifier. For example, a Gm may receive an input signal, and may output an amplified signal.

Figure 1B:
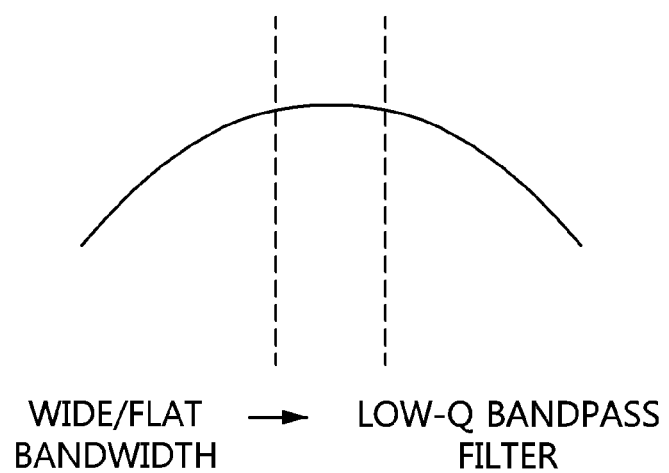
Figure 1C:
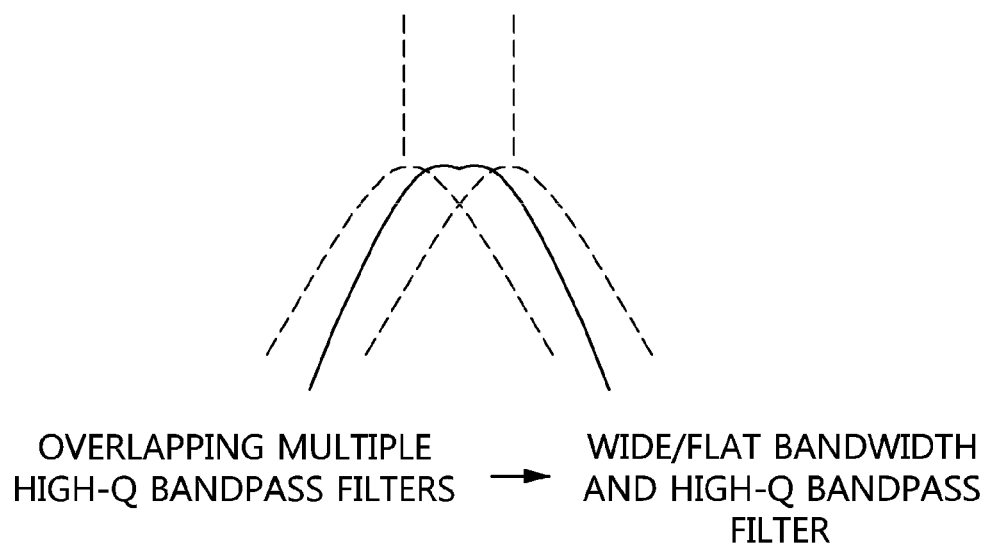

FIGS. 1A to 1C illustrate the implementation characteristics of a bandpass filter according to an embodiment.

FIG. 1A shows the characteristic of a filter having a high-quality factor according to an embodiment.

According to the filter characteristic illustrated in FIG. 1A, when a required signal band is narrow, an out-of-band interference signal may be greatly suppressed.

However, when a passive integrated circuit element, such as an LC (namely, an inductor and a capacitor), is used in a filter, it may be difficult to practically acquire the filter characteristic having such a high-quality factor. Therefore, to acquire the narrow bandpass characteristic, a structure applying a switched capacitor filter, which uses an active element and a capacitor, may be used.

In other words, the high-Q bandpass filter may have the narrow bandpass characteristic.

FIG. 1B illustrates a characteristic of a filter of which a bandpass characteristic is worsed, according to an embodiment.

The filter characteristic in FIG. 1B shows that the bandpass characteristic (which is a quality factor) of the filter is worsed. Here, the bandpass characteristic of the filter may be worsed to realize pass-band flatness when a signal having a relatively wide bandwidth is processed.

When the bandpass characteristic of the filter is worsed, the suppression characteristic of the filter may not be good in bands outside of the pass-band. Also, when the bandpass characteristic of the filter is worsed, even though a switched capacitor filter is used, it may be required to intentionally reduce the quality factor (de-Q). In other words, in order to impart the bandpass filter with a wide/flat bandwidth, a low-Q bandpass filter may be required.

FIG. 1C illustrates a filter characteristic in which the transfer characteristics of the narrow bandpass filters are overlapped parallel to the frequency axis.

The illustrated filter characteristic shows that the weakness of the filter characteristic of FIG. 1B is compensated for. If the transfer characteristics of the narrow bandpass filters, illustrated in FIG. 1A, are overlapped parallel to the frequency axis, good pass-band flatness may be maintained and suppression may be improved in bands outside of the pass-band. In other words, the overlapping multiple high-Q bandpass filters may have both the wide/flat bandwidth and the characteristic of the high-Q bandpass filter.

Figure 2:
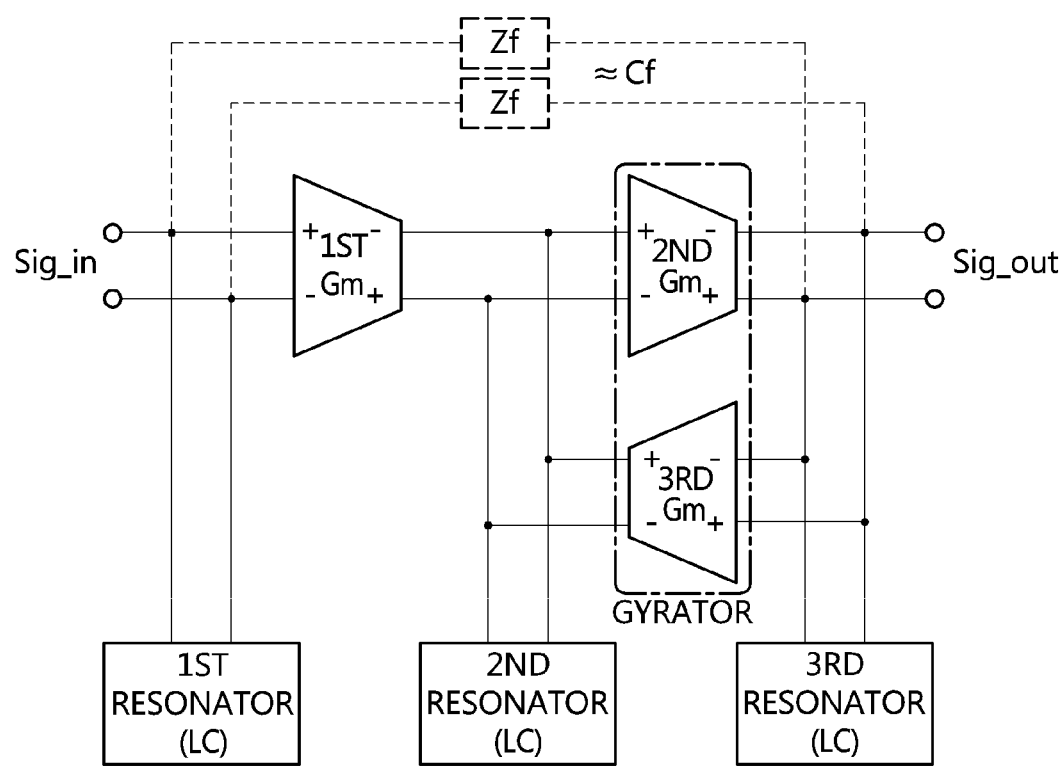
FIG. 2 illustrates the implementation of the filter of FIG. 1C.

FIG. 2 illustrates the implementation of the filter of FIG. 1C.

The filter illustrated in FIG. 2 represents a filter in which the filter characteristic of FIG. 1C is implemented.

Sig_in, which is an input signal of the filter, and Sig_out, which is an output signal of the filter, are illustrated in FIG. 2.

The filter may include a first resonator, a second resonator, and a third resonator. Each of the first resonator, the second resonator, and the third resonator may be an LC circuit.

The filter may include a first Gm and a gyrator. The gyrator may include a second Gm and a third Gm. Also, the filter may include at least one negative feedback impedance element Zf.

A negative Gm for improving the Q-factor of the filter may be attached to both ends of the gyrator.

The first resonator may perform first filtering of the input signal Sig_in. Here, the filtering may be bandpass filtering.

The first Gm may receive the input signal Sig_in and output the output signal Sig_out. The first Gm may control a gm value for gain control between the voltage of the input signal Sig_in and the current of the output signal Sig_out.

The second resonator and the third resonator may perform additional filtering and bandwidth extension. Here, the filtering may be bandpass filtering.

The second Gm and the third Gm of the gyrator may connect the first Gm, the second resonator, and the third resonator with each other.

The negative feedback impedance element Zf may be additionally configured for low noise and correction of the filter transfer characteristic. The negative feedback impedance element Zf may correct the transfer characteristic of the filter.

The negative feedback impedance element Zf may comprise a plurality of negative feedback impedance elements, and each of the negative feedback impedance elements may be connected to the input signal Sig_in and the output signal Sig_out, according to the polarity of the signals.

Figure 3:
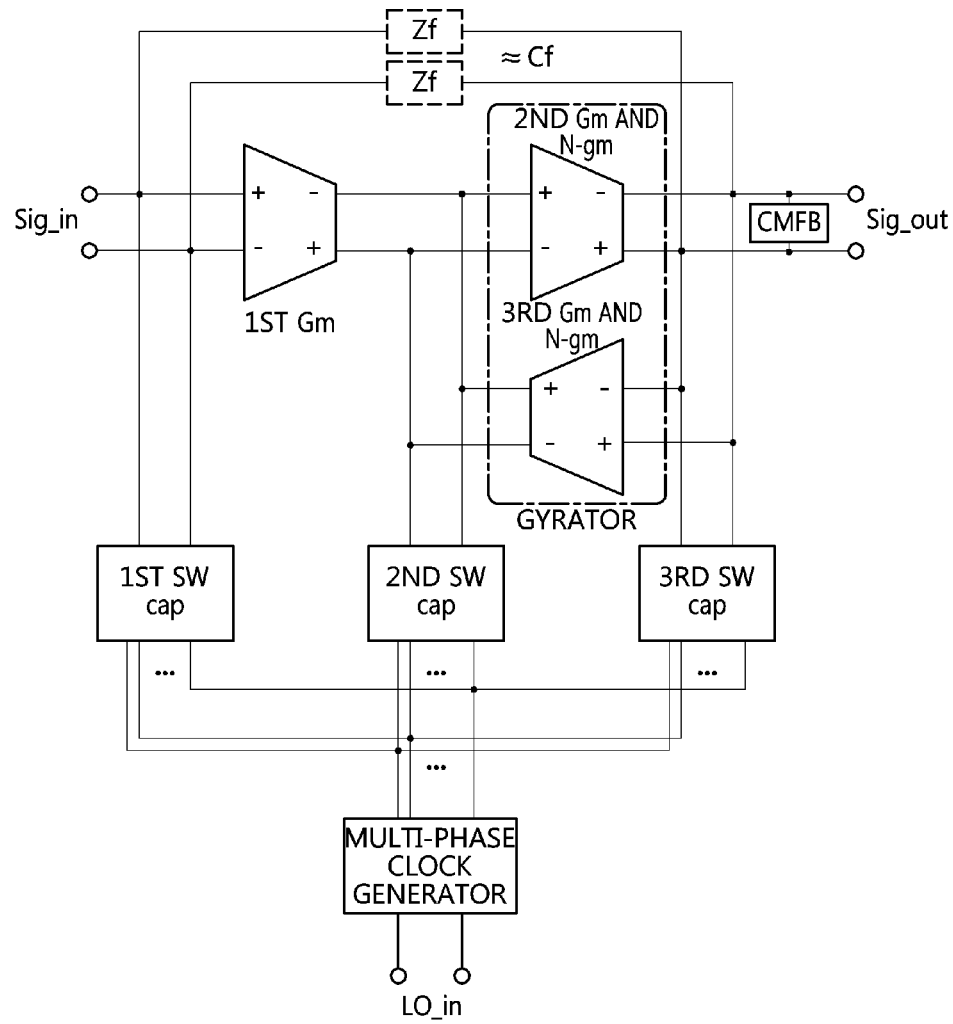
FIG. 3 illustrates the implementation of the filter of FIG. 1C, which uses a switched gmC N-path filter.

FIG. 3 illustrates the implementation of the filter of FIG. 1C, which uses a switched gmC N-path filter.

The filter illustrated in FIG. 3 may be a filter in which the filter characteristic of FIG. 1C is implemented using a switched gmC N-path filter. Namely, the filter illustrated in FIG. 3 may be a bandpass filter that uses parallel overlapping of bandpass characteristics.

Sig_in, which is an input signal of the filter, and Sig_out, which is an output signal of the filter, are illustrated in FIG. 3.

The filter may include a first switched capacitor (SW cap), a second SW cap, and a third SW cap.

The filter may include a first Gm and a gyrator. The gyrator may include a second Gm and a third Gm. The filter may include at least one negative feedback impedance element Zf.

The filter may include a multi-phase clock generator. LO_in, which is a signal for generating a multi-phase clock, may be input to the multi-phase clock generator.

The filter may include a Common Mode FeedBack (CMFB) circuit.

The first SW cap may perform first filtering of the input signal Sig_in. Here, the filtering may be bandpass filtering.

The first Gm may receive the input signal Sig_in, and may output the output signal Sig_out. The first Gm may control a gm value for gain control between the voltage of the input signal Sig_in and the current of the output signal Sig_out.

The second SW cap and the third SW cap may perform additional filtering and bandwidth extension. Here, the filtering may be bandpass filtering.

The second Gm and the third Gm of the gyrator may connect the first Gm, the second SW cap, and the third SW cap with each other. A small negative gm (N-gm) may be included in each of both nodes (that is, the second SW cap and the third SW cap) of the gyrator.

The negative feedback impedance element Zf may be configured for low noise and correction of the filter transfer characteristic. The negative feedback impedance element Zf may correct the transfer characteristic of the filter.

The negative feedback impedance element Zf may comprise a plurality of negative feedback impedance elements, and each of the negative feedback impedance elements may be connected to the positive (+) terminals and the negative (−) terminals of the input signal Sig_in and output signal Sig_out.

The first SW cap, the second SW cap, and the third SW cap may receive a multi-phase clock, and may be operated by receiving the multi-phase clock. The N-path bandpass filter may be implemented by the operations of the first SW cap, the second SW cap, and the third SW cap.

Figure 4:
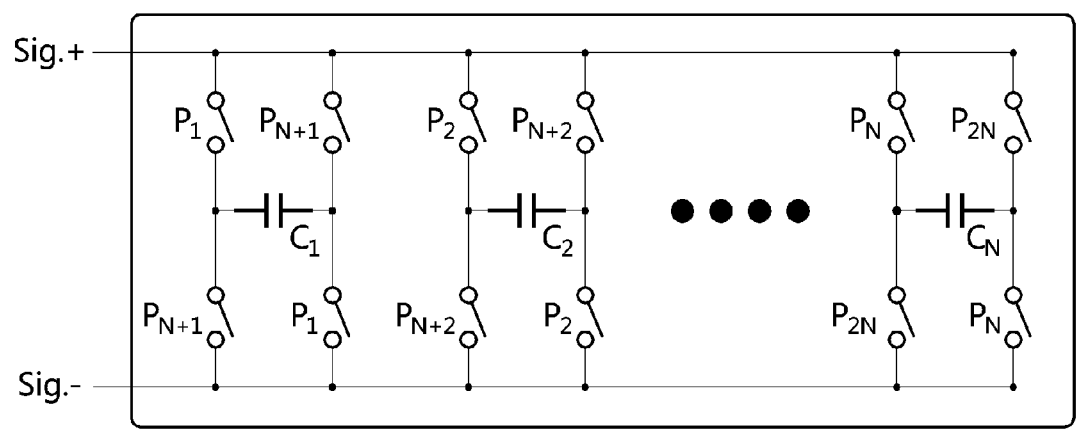
FIG. 4 illustrates the inside of a switched capacitor according to an embodiment.

FIG. 4 illustrates the inside of a switched capacitor according to an embodiment.

FIG. 4 represents the inside of the SW cap. The SW cap illustrated in FIG. 4 may correspond to the first SW cap, the second SW cap, and the third SW cap, which are described above with reference to FIG. 3.

In FIG. 4, Sig.+ may indicate the positive (+) terminal of an input signal. Sig.− may indicate the negative (−) terminal of the input signal.

The SW cap may include switched capacitors $C_1$ to $C_N$. The SW cap may include switches $P_1$ to $P_{2n}$. Here, n may be an integer of 1 or more. As illustrated in FIG. 4, each of the switches $P_1$ to $P_{2n}$ comprises two switches or may operate in two positions. For example, each of the switches $P_1$ to $P_{2n}$ may be disposed above and below the capacitors $C_1$ to $C_N$.

The switch $P_j$ (where j is equal to or greater than 1 and is equal to or less than N) disposed above the capacitors may connect Sig.+ with the first terminal of a capacitor $C_j$. The switch $P_{N+j}$ disposed below the capacitors may connect the first terminal of the capacitor $C_j$ with Sig.−. Also, the switch $P_{N+j}$ disposed above the capacitors may connect Sig.+ with the second terminal of the capacitor $C_j$. The switch $P_j$ disposed below the capacitors may connect the second terminal of the capacitor $C_j$ with Sig.−.

The SW cap may receive the multi-phase clock of the switches $P_1$ to $P_N$. The capacitors $C_1$ to $C_n$ may be switched by the multi-phase clock.

The SW cap configured as shown in FIG. 4 may have a characteristic of a high-Q bandpass filter in the frequency band of the input clock. In other words, the illustrated SW cap may be an N-path bandpass filter.

An output signal of an amplification stage may be non-linear to an input signal of the amplification stage. According to the configuration of the filter illustrated in FIGS. 2 and 3, the first resonator of FIG. 2 and the first SW cap of FIG. 3 may be arranged before the first amplification stage. Through this arrangement, the filter may attenuate out-of-band interference signals before the nonlinear amplification stage. The filter may improve out-of-band linearity through the attenuation of the out-of-band interference signals.

Meanwhile, gain control, which can be applied to both a very small signal and a very large signal, may be required in order to apply the filter of FIGS. 2 and 3 to a practical communication receiver. Generally, in the case of the filter of FIGS. 2 and 3, it may be most effective to perform gain control before and after the first Gm of the first stage. However, unless a special method is used, a gain control method using control of current or load impedance may control the gain but may distort the transfer characteristics of the filter due to the gain control.

The following embodiment proposes a method capable of performing gain control while maintaining the transfer characteristics of the filter.

Figure 5:
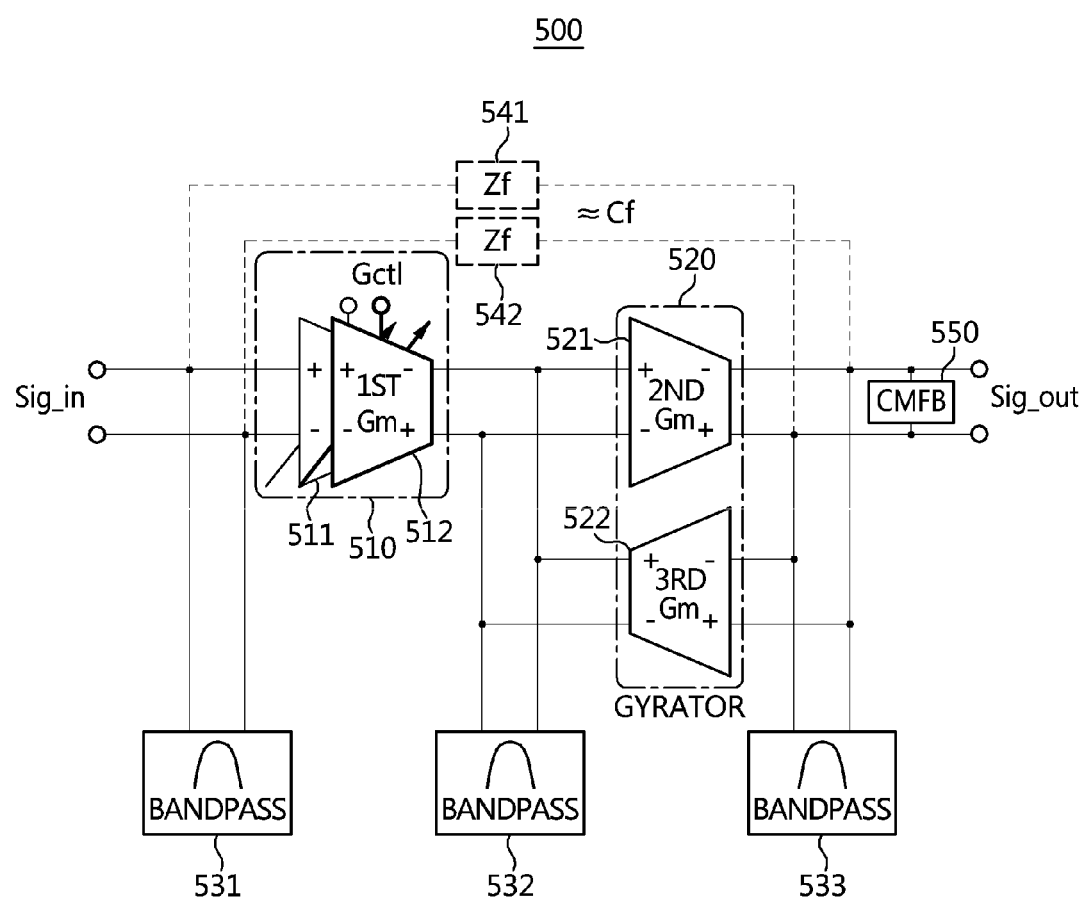
FIG. 5 illustrates the configuration of a bandpass filter that provides gain control, according to an embodiment.

FIG. 5 illustrates the configuration of a bandpass filter that provides gain control, according to an embodiment.

The bandpass filter 500 may represent the structure of a filter that can perform gain control for a wide input signal amplitude range (signal dynamic range). The bandpass filter 500 may be used in a transmitter and a receiver.

The bandpass filter 500 may include a gain control unit 510, a gyrator 520, a first resonator 531, a second resonator 532, a third resonator 533, at least one Zf, and a CMFB 550. The gain control unit 510 may include a predistorter 511 and a first Gm 512. The gyrator 520 may include a second Gm 521 and a third Gm 522. The Zf may comprise a first Zf 541 and a second Zf 542.

FIG. 5 illustrates the connection between components of the bandpass filter 500. For example, the first terminal of an input signal Sig_in, the positive (+) input terminal of the gain control unit 510, the first terminal of the first Zf 541, and the first terminal of the first resonator 531 may be connected with each other. Also, the second terminal of the input signal Sig_in, the negative (−) input terminal of the gain control unit 510, the first terminal of the second Zf 542, and the second terminal of the first resonator 531 may be connected with each other. The positive (+) output terminal of the gain control unit 510, the negative (−) input terminal of the second Gm 521, the negative (−) output terminal of the third Gm 522, and the first terminal of the second resonator 532 may be connected with each other. Also, the negative (−) output terminal of the gain control unit 510, the positive (+) input terminal of the second Gm 521, the positive (+) output terminal of the third Gm 522, and the second terminal of the second resonator 532 may be connected with each other.

The first terminal of an output signal Sig_out, the first terminal of the CMFB 550, the negative (−) output terminal of the second Gm 521, the positive (+) input terminal of the third Gm 522, the second terminal of the second Zf 542, and the second terminal of the third resonator 533 may be connected with each other. Also, the second terminal of the output signal Sig_out, the second terminal of the CMFB 550, the positive (+) output terminal of the second Gm 521, the negative (−) input terminal of the third Gm 522, the second terminal of the first Zf 541, and the first terminal of the third resonator 533 may be connected with each other.

The positive (+) input terminal of the gain control unit 510 may be connected to the positive (+) input terminal of the predistorter 511. The negative (−) input terminal of the gain control unit 510 may be connected to the negative (−) input terminal of the predistorter 511. The positive (+) output terminal of the gain control unit 510 may be connected to the positive (+) output terminal of the first Gm 512. The negative (−) output terminal of the gain control unit 510 may be connected to the negative (−) output terminal of the first Gm 512.

Not only the filters described above with reference to FIGS. 2 and 3 but also a general amplifier may use a gain control method that controls current, which is transmitted as the output load, or that controls the output load. However, if this gain control method is applied to the first Gm of FIG. 2 and the first Gm of FIG. 3, the total impedance of the first Gm may be changed. Also, due to the change in the total impedance of the first Gm, the transfer characteristic of the filter that is connected to the gyrator may also be changed.

In other words, due to the change in the total impedance of the first Gm, the quality factor of the filter may be changed, or the transfer characteristics of the filters connected to the gyrator may be changed and thus become unbalanced. This change may become more severe depending on the variation in the current or in the load impedance when wide-range gain control is implemented.

Another gain control method is a method in which the amplitude of an input signal is attenuated in phases through control. However, this method also may decrease the amplitude of the signal passing through the first Gm, and may generate peaking in both sides of the pass-band of the final output signal of the filter.

The bandpass filter 500 of the embodiment may use a complementary method to solve the above problem. The configuration of the bandpass filter 500 and gain control unit 510, using the complementary method, is described in detail.

The first resonator 531 may perform first filtering of the input signal Sig_in.

The gain control unit 510 may be a circuit for gain control. The gain control unit 510 may perform gain control between the voltage of Sig_in, which is the input signal of the bandpass filter 500, and the current of Sig_out, which is the output signal of the bandpass filter 500. In other words, the gain control unit 510 may control a gm value of voltage-to-current (V-to-I) for gain control of the bandpass filter 500. The gain control unit 510 may perform gain control of the bandpass filter 500 by controlling the gm value.

Also, the gain control unit 510 may perform compensation for the filter Q and the flatness of the bandpass filter 500. For the compensation, the gain control unit 510 may perform pre-distortion corresponding to the transfer characteristic of the bandpass filter 500.

The gain control unit 510 may receive a gain control signal Gctl, and may perform gain control of the bandpass filter 500 according to the gain control signal Gctl.

The predistorter 511 may compensate for the decrease in a quality factor according to gain control of the gain control unit 510.

For gain control, the gm value of the first Gm 512 may be changed. Namely, the first Gm 512 may change the gm value for gain control.

The transfer characteristic of the bandpass filter 500, the quality factor of which is decreased (de-Q) by the gain control unit 510, may be complementarily compensated by the predistorter 511. The transfer characteristic may include at least one of the flatness factor and the Q-factor of the filter.

The above-mentioned complementary method may use a predistorter 511 to compensate for the decrease in the quality factor, which is caused by the gain control of the first Gm 512. In the case of gain control by the first Gm 512, as gain decreases, the quality factor of the final output signal Sig_out of the bandpass filter 500 may become worse. In order for the bandpass filter 500 to perform wide-range gain control, compensation for the transfer characteristic of the bandpass filter 500 may be required. For the required compensation, the predistorter 511 may attenuate the input signal Sig_in in phases to correspond to the phase of gain control of the first resonator 531 and first Gm 512. The attenuation of the input signal Sig_in by the predistorter 511 may simultaneously be performed with the gain control by the first resonator 531 and first Gm 512.

The second resonator 532 and the third resonator 533 may perform additional bandpass filtering and bandwidth extension. Namely, the first resonator 531, the second resonator 532, and the third resonator 533 may perform the function of the bandpass filter.

The gyrator 520 may connect the gain control unit 510, the second resonator 532, and the third resonator 533 with each other. A negative Gm (n-Gm) having a small size and small capacity for improving the Q-factor of the bandpass filter 500 may be attached to both nodes of the gyrator 520. Here, the two nodes may be the second resonator 532 and the third resonator 533.

The negative feedback impedance element may correct the transfer characteristic of the bandpass filter 500. The negative feedback impedance element comprises a plurality of negative feedback impedance elements, and each of the negative feedback impedance elements may include at least one capacitor and at least one resistor.

The CMFB 550 may be connected to both terminals of the output signal Sig_out.

The first resonator 531, the second resonator 532, and the third resonator 533 may receive a multi-phase clock, and may be operated by receiving the multi-phase clock. The N-path bandpass filter may be implemented by the first resonator 531, the second resonator 532, and the third resonator 533, which are operated by receiving the multi-phase clock.

Figure 6:
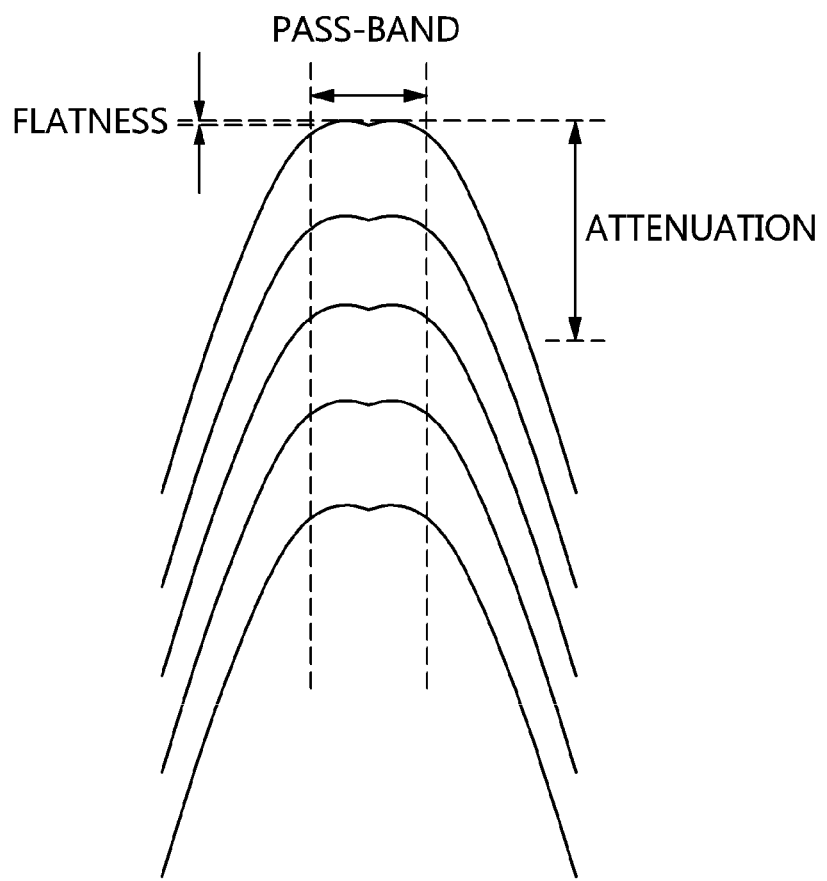
FIG. 6 illustrates the final output signal of a bandpass filter according to an embodiment.

FIG. 6 illustrates the final output signal of a bandpass filter according to an embodiment.

In the graph of FIG. 6, the output signals of the gain-controlled bandpass filter 500 are illustrated. As the characteristics of the output signals, the pass-band, the flatness, and the attenuation of the output signals are illustrated in FIG. 6.

The gain controlled outputs may impart a constant quality factor to the bandpass filter by using the Q and flatness compensation gain control method of the bandpass filter 500.

As illustrated in FIG. 6, although gain control for the final output signal Sig_out of the bandpass filter 500 is performed, the suppression ratio in bands outside of the pass-band may be maintained constant, and good pass-band flatness may be maintained.

By the above-mentioned characteristic of the bandpass filter 500, the interference signal may be effectively suppressed both in high-gain mode and low-gain mode. Also, according to the above-mentioned characteristic of the bandpass filter 500, among in-band signals, a wide-range signal may be processed through the wide gain control range.

Figure 7:
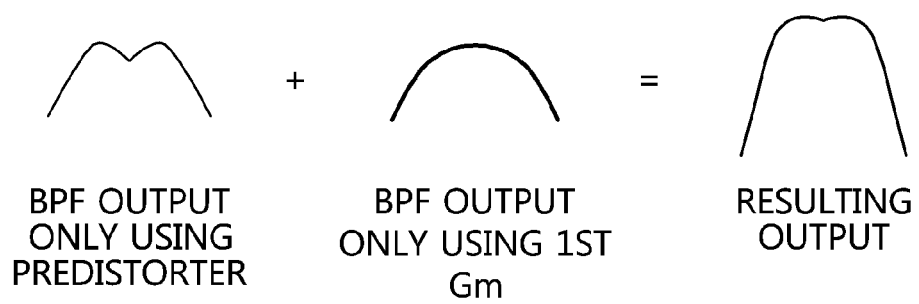
FIG. 7 describes the principle of a bandpass filter according to an embodiment, using a graph.

FIG. 7 describes the principle of a bandpass filter according to an embodiment, using a graph.

In FIG. 7, the graph on the left represents the output of the bandpass filter using the predistorter 511. The graph in the middle represents the output of the bandpass filter when the predistorter 511 does not exist and gain control is performed only by the first Gm 512. The graph on the right represents the resulting output when the predistorter 511 exists. Here, the output of the bandpass filter may be the final output signal Sig_out of the bandpass filter 500.

Referring to the graphs of FIG. 7, in high-gain mode, even though the predistorter 511 does not exist, the bandpass filter 500 may have the required characteristic. For example, the bandpass filter 500 may have good pass-band flatness, and may suppress the signal in bands outside of the pass-band.

However, as the gain of the bandpass filter 500 decreases, both edges of the output signal of the bandpass filter may subside, and thus a high-Q factor may not be obtained.

Also, when gain control is performed only using the predistorter 511 without the control of the first Gm 512, as the gain of the bandpass filter 500 decreases, peaking at both edges of the final output signal Sig_out may be larger. The graph on the left of FIG. 7 shows that peaking is larger at both edges.

The gain control function may be implemented by an attenuator. For example, for the final output signal, the attenuator may perform the function of the predistorter 511.

As the gain decreases, the amplitude of the signal transmitted by the first resonator 531 to the final output signal Sig_out may be decreased. Also, as the amplitude of the signal transmitted by the first resonator 531 to the final output signal Sig_out is decreased, peaking at both edges of the final output signal Sig_out may be larger.

In other words, in the gain control, the filter Q-factor of the first Gm 512 and that of the predistorter 511 may have an inverse correlation. Accordingly, for the gain control, a complementary result may be obtained by the combination of the first Gm 512 and the predistorter 511.

Figure 8:
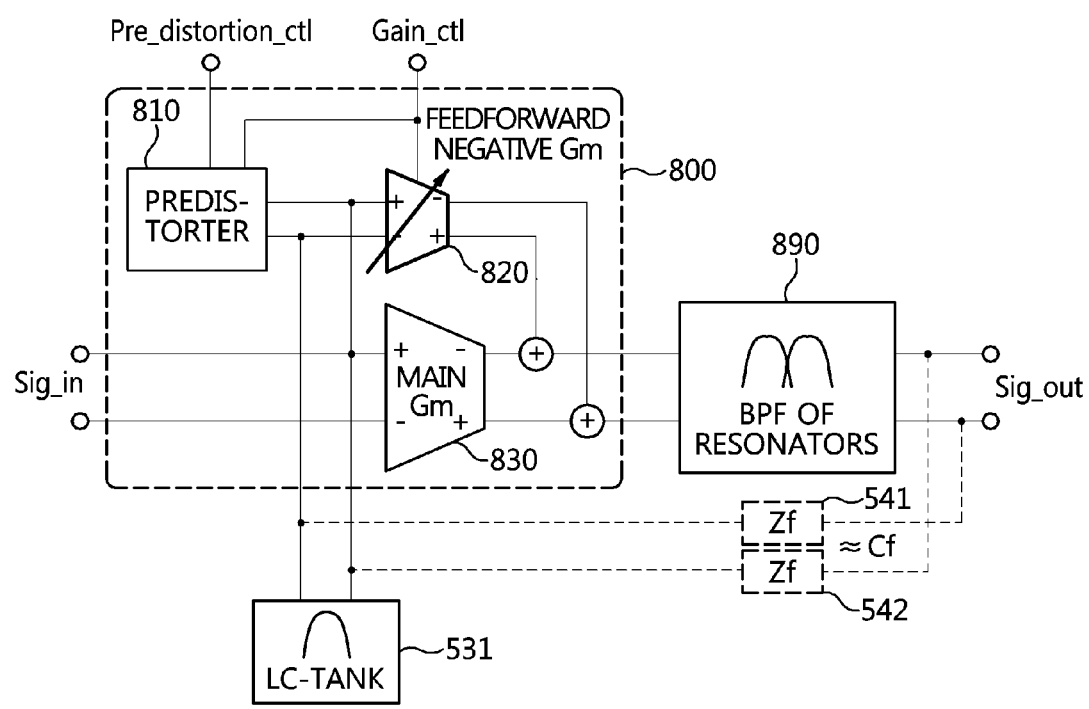
FIG. 8 illustrates the configuration of a gain control unit according to an embodiment.

FIG. 8 illustrates the configuration of the gain control unit according to an embodiment.

The gain control unit 800 of FIG. 8 may correspond to the gain control unit 510 described above with reference to FIG. 5. Namely, the gain control unit 510 of the bandpass filter 500 may be substituted by the gain control unit 800.

The analog-based bandpass filter that uses parallel overlapping of bandpass characteristics was described with reference to FIG. 2. The gain control unit 800 may represent a structure for gain control capable of processing a wide input signal amplitude range.

The gain control unit 800 may include a predistorter 810, a feedforward negative Gm 820, and a main Gm 830.

FIG. 8 illustrates the connection between the components of the gain control unit 800. For example, the first terminal of the predistorter 810, the positive (+) input terminal of the feedforward negative Gm 820, the positive (+) input terminal of the main Gm 830, the second terminal of the first resonator 531, and the first terminal of the second Zf 542 may be connected with each other. Also, the second terminal of the predistorter 810, the negative (−) input terminal of the feedforward negative Gm 820, the negative (−) input terminal of the main Gm 830, the first terminal of the first resonator 531, and the first terminal of the first Zf 541 may be connected with each other. The negative (−) output terminal of the feedforward negative Gm 820, the positive (+) output terminal of the main Gm 830, and the first terminal of the bandpass filter 890 of the resonators may be connected with each other. Here, the bandpass filter 890 of the resonators may represent the gyrator 520, the second resonator 532, and the third resonator 533, which have been described above with reference to FIG. 5. Also, the first terminal of the bandpass filter 890 of the resonators may represent the connection with the negative (−) output terminal of the gain control unit 800. Also, the positive (+) output terminal of the feedforward negative Gm 820, the negative (−) output terminal of the main Gm 830, and the second terminal of the bandpass filter 890 of the resonators may be connected with each other. The third terminal of the bandpass filter 890 of the resonators may be the connection with the first terminal of the output signal Sig_out of FIG. 5. The fourth terminal of the bandpass filter 890 of the resonators may be the connection with the second terminal of the output signal Sig_out of FIG. 5.

The first resonator 531 may perform the function of an LC-tank, and is illustrated as the LC-tank.

The predistorter 810 may compensate for the decrease in the quality factor caused by gain control of the gain control unit 800.

The predistorter 810 may receive a pre-distortion control signal Pre_distortion_ctl, and may control the pre-distortion according to the pre-distortion control signal Pre_distortion_ctl.

The predistorter 810 may perform gain control, and distort, in advance, the transfer characteristic for the final output signal Sig_out.

The main Gm 830 may adjust a gm value for gain control between the voltage of the input signal Sig_in and the current of the output signal Sig_out.

The feedforward negative Gm 820 may be connected to the main Gm 830 in parallel. The outputs of the feedforward negative Gm 820 and the outputs of the main Gm 830 may be connected with each other. Also, the feedforward negative Gm 820 outputs a signal having a polarity reverse to that of the main Gm 830, whereby the gain may be controlled by the gain control unit 800.

The feedforward negative Gm 820 and the main Gm 830 may receive a gain control signal Gain_ctl, and may control the gain according to the gain control signal Gain_ctl.

The gyrator 520, the first resonator 531, the second resonator 532, the third resonator 533, the at least one Zf, and the CMFB 550, which have been described above with reference to FIG. 5, may perform functions that are the same as those described above with reference to FIG. 5 for the gain control unit 800. Redundant descriptions will be omitted.

Figure 9:
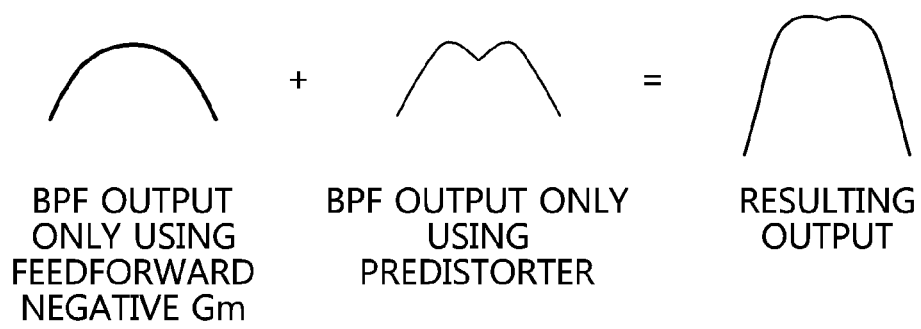
FIG. 9 describes the principle of an analog-based bandpass filter according to an embodiment, using a graph.

FIG. 9 describes the principle of the analog-based bandpass filter according to an embodiment, using a graph.

In FIG. 9, the graph on the left represents the output of the bandpass filter only using the feedforward negative Gm 820. The graph in the middle represents the output of the bandpass filter only using a predistorter 810. The graph on the right represents the resulting output by the combination of the predistorter 810 and the feedforward negative Gm 820. Here, the output of the bandpass filter may be a final signal Sig_out of the bandpass filter 500 using the gain control unit 800.

Figure 10:
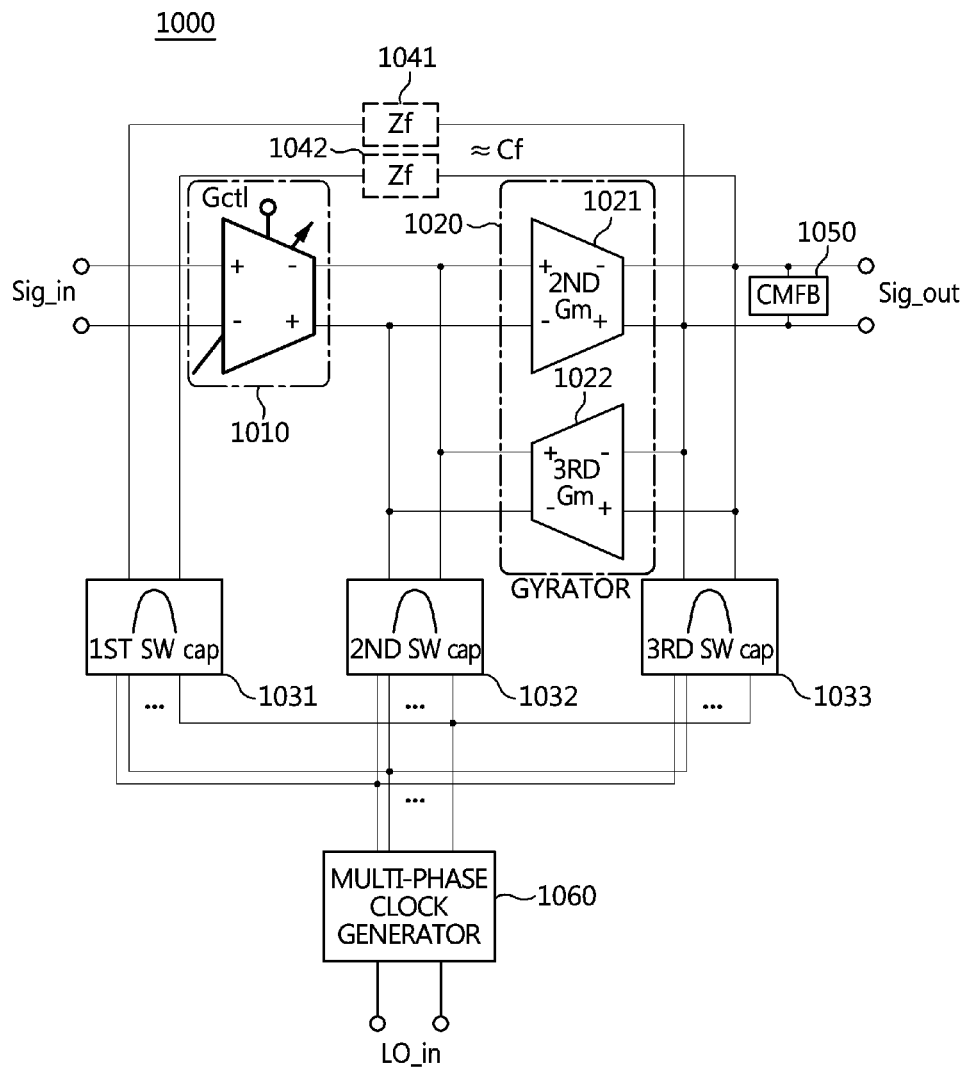
FIG. 10 illustrates the configuration of a switched gmC N-path bandpass filter that provides gain control, according to an embodiment.

FIG. 10 illustrates the configuration of a switched gmC N-path bandpass filter that provides gain control, according to an embodiment.

The switched gmC N-path bandpass filter 1000 may represent the structure of a filter that may perform gain control for a signal dynamic range. The switched gmC N-path bandpass filter 1000 may be used in a transmitter and a receiver.

The switched gmC N-path bandpass filter 1000 may include a gain control unit 1010, a gyrator 1020, a first SW cap 1031, a second SW cap 1032, a third SW cap 1033, at least one Zf, a CMFB 1050, and a multi-phase clock generator 1060. The gain control unit 1010 may be regarded as a first Gm. The gyrator 1020 may include a second Gm 1021 and a third Gm 1022. The at least one Zf may comprise a first Zf 1041 and a second Zf 1042.

FIG. 10 represents the connection between the components of the switched gmC N-path bandpass filter 1000. For example, the first terminal of an input signal Sig_in, the positive (+) input terminal of the gain control unit 1010, the first terminal of the first Zf 1041, and the first terminal of the first SW cap 1031 may be connected with each other. Also, the second terminal of the input signal Sig_in, the negative (−) input terminal of the gain control unit 1010, the first terminal of the second Zf 1042, and the second terminal of the first SW cap 1031 may be connected with each other. The positive (+) output terminal of the gain control unit 1010, the negative (−) input terminal of the second Gm 1021, the negative (−) output terminal of the third Gm 1022, and the first terminal of the second SW cap 1032 may be connected with each other. Also, the negative (−) output terminal of the gain control unit 1010, the positive (+) input terminal of the second Gm 1021, the positive (+) output terminal of the third Gm 1022, and the second terminal of the second SW cap 1032 may be connected with each other.

The first terminal of an output signal Sig_out, the first terminal of the CMFB 1050, the negative (−) output terminal of the second Gm 1021, the positive (+) input terminal of the third Gm 1022, the second terminal of the second Zf 1042, and the second terminal of the third SW cap 1033 may be connected with each other. Also, the second terminal of the output signal Sig_out, the second terminal of the CMFB 1050, the positive (+) output terminal of the second Gm 1021, the negative (−) input terminal of the third Gm 1022, the second terminal of the first Zf 1041, and the first terminal of the third SW cap 1033 may be connected with each other.

The first SW cap 1031 may perform first filtering of the input signal Sig_in.

The gain control unit 1010 may perform gain control between the voltage of the input signal Sig_in and the current of the output signal Sig_out of the switched gmC N-path bandpass filter 1000. Namely, the gain control unit 1010 may control a gm value of voltage-to-current (V-to-I) for gain control. The gain control unit 1010 may perform gain control of the switched gmC N-path bandpass filter 1000 by controlling the gm value.

Also, the gain control unit 1010 may compensate for the filter Q and the flatness of the switched gmC N-path bandpass filter 1000. For the compensation, the gain control unit 1010 may perform pre-distortion corresponding to the transfer characteristic of the switched gmC N-path bandpass filter 1000.

The gain control unit 1010 may receive a gain control signal Gctl, and may perform gain control of the switched gmC N-path bandpass filter 1000 according to the gain control signal Gctl.

The second SW cap 1032 and the third SW cap 1033 may perform additional bandpass filtering and bandwidth extension. Namely, the first SW cap 1031, the second SW cap 1032, and the third SW cap 1033 may perform the function of the bandpass filter.

The gyrator 1020 may connect the gain control unit 1010, the second SW cap 1032, and the third SW cap 1033 with each other. A negative Gm (n-Gm) having small size and small capacity for improving the Q-factor of the switched gmC N-path bandpass filter 1000 may be attached to both nodes of the gyrator 1020. Here, the two nodes may be the second SW cap 1032 and the third SW cap 1033.

The negative feedback impedance element Zf may correct the transfer characteristic of the switched gmC N-path bandpass filter 1000. The negative feedback impedance element may comprise a plurality of negative feedback impedance elements, and each of the negative feedback impedance elements may include at least one capacitor and at least one resistor.

The CMFB 1050 may be connected to both terminals of the output signal Sig_out.

The multi-phase clock generator 1060 may generate a multi-phase clock. The first SW cap 1031, the second SW cap 1032, and the third SW cap 1033 may receive the multi-phase clock from the multi-phase clock generator 1060, and may be operated by receiving the multi-phase clock. The N-path bandpass filter may be implemented by the first SW cap 1031, the second SW cap 1032, and the third SW cap 1033, which are operated by receiving the multi-phase clock.

Not only the filters described above with reference to FIGS. 2 and 3 but also a general amplifier uses a gain control method that controls current, which is transmitted as the output load, or that controls the output load. However, if this gain control method is applied to the first Gm of FIG. 2 and the first Gm of FIG. 3, the total impedance of the first Gm may be changed. Also, due to the change in the total impedance of the first Gm, the transfer characteristic of the filter connected to the gyrator may also be changed.

In other words, due to the change in the total impedance of the first Gm, the quality factor of the filter may be changed, or the transfer characteristics of the filters connected to the gyrator may be changed and thus become unbalanced. This change may become more severe depending on the variation in the current or in the load impedance when wide-range gain control is implemented.

Another gain control method is a method in which the amplitude of an input signal is attenuated in phases through control. However, this method may also decrease the amplitude of the signal passing through the first Gm, and may generate peaking at both sides of the pass-band of the final output signal of the filter.

The switched gmC N-path bandpass filter 1000 of the embodiment may use a complementary method to solve the above problem. The configuration of the switched gmC N-path bandpass filter 1000 and gain control unit 1010, using the complementary method, is described in detail with reference to FIG. 11.

Figure 11:
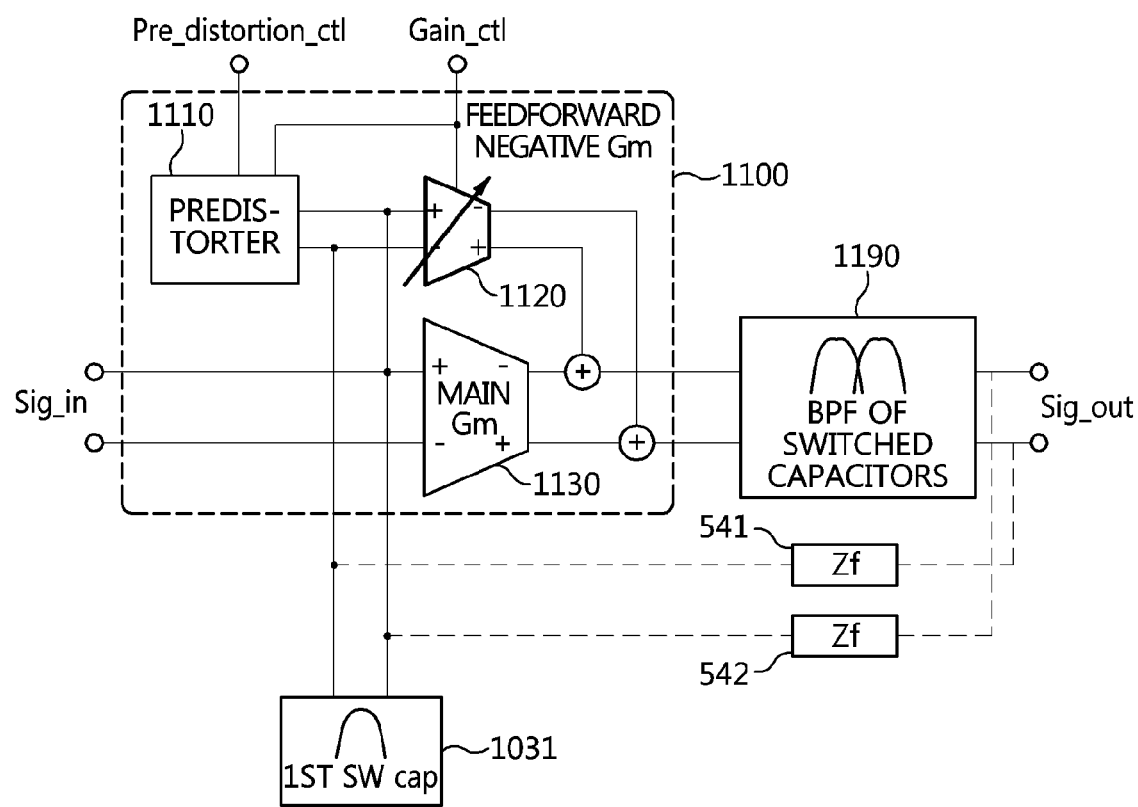
FIG. 11 illustrates the configuration of a gain control unit according to an embodiment.

FIG. 11 illustrates the configuration of the gain control unit according to an embodiment.

The gain control unit 1100 of FIG. 11 may correspond to the gain control unit 1010 described above with reference to FIG. 10. In other words, the gain control unit 1010 of the switched gmC N-path bandpass filter 1000 may be substituted by the gain control unit 1100.

The switched gmC N-path bandpass filter that uses parallel overlapping of bandpass characteristics has been described with reference to FIG. 3. The gain control unit 1100 may represent a structure for gain control capable of processing a wide input signal amplitude range.

The gain control unit 1100 may include a predistorter 1110, a feedforward negative Gm 1120, and a main Gm 1130.

FIG. 11 illustrates the connection between the components of the gain control unit 1100. For example, the first terminal of the predistorter 1110, the positive (+) input terminal of the feedforward negative Gm 1120, the positive (+) input terminal of the main Gm 1130, the second terminal of the first SW cap 1031, and the first terminal of the second Zf 542 may be connected with each other. Also, the second terminal of the predistorter 1110, the negative (−) input terminal of the feedforward negative Gm 1120, the negative (−) input terminal of the main Gm 1130, the first terminal of the first SW cap 1031, and the first terminal of the first Zf 541 may be connected with each other. The negative (−) output terminal of the feedforward negative Gm 1120, the positive (+) output terminal of the main Gm 1130, and the first terminal of the bandpass filter 1190 of the switched capacitors may be connected with each other. Here, the bandpass filter 1190 of the switched capacitors may repre-sent the gyrator 1020, the second switched capacitor 1032, and the third switched capacitor 1033, which are described above with reference to FIG. 10. Also, the first terminal of the bandpass filter 1190 of the switched capacitors may represent the connection with the negative (−) output terminal of the gain control unit 1100. Also, the positive (+) output terminal of the feedforward negative Gm 1120, the negative (−) output terminal of the main Gm 1130, and the second terminal of the bandpass filter 1190 of the switched capacitors may be connected with each other. The third terminal of the bandpass filter 1190 of the switched capacitors may be the connection with the first terminal of the output signal Sig_out of FIG. 10. The fourth terminal of the bandpass filter 1190 of the switched capacitors may be the connection with the second terminal of the output signal Sig_out of FIG. 10.

The predistorter 1110 may receive a pre-distortion control signal Pre_distortion_ctl, and may control the pre-distortion according to the pre-distortion control signal Pre_distortion_ctl.

The predistorter 1110 may perform gain control, and may distort, in advance, the transfer characteristic for the final output signal Sig_out.

The main Gm 1130 may control a gm value for gain control between the voltage of the input signal Sig_in and the current of the output signal Sig_out.

The feedforward negative Gm 1120 may be connected to the main Gm 1130 in parallel. The outputs of the feedforward negative Gm 1120 and the outputs of the main Gm 1130 may be connected with each other. The feedforward negative Gm 1120 outputs a signal having a polarity reverse to that of the main Gm 1130, whereby the gain may be controlled by the gain control unit 1100.

Through the parallel connection, the problem of gain control, described above with reference to FIG. 10, may be solved by the predistorter 1110. For example, the predistorter 1110 may compensate for the decrease in the quality factor according to the gain control of the gain control unit 1100.

The transfer characteristic of the switched gmC N-path bandpass filter 1000, the quality factor of which is decreased (de-Q) according to gain control of the main Gm 1130, may be maintained by the predistorter 1110. The transfer characteristic may include at least one of the filter flatness factor and the filter Q factor.

The feedforward negative Gm 1120 and the main Gm 1130 may receive a gain control signal Gain_ctl, and may control the gain according to the gain control signal Gain_ctl.

The gain control method that connects the feedforward negative Gm 1120 and the main Gm 1130 in parallel may control gain by adding the negative (−) signal output from the feedforward negative Gm 1120 to the positive (+) signal output from the main Gm 1130, unlike the gain control method in which the current or load of the main Gm 1130 is controlled. Because gain is controlled by adding the negative (−) signal to the positive (+) signal, the quality factor of the switched gmC N-path bandpass filter 1000 may not be greatly changed, and the pass-band flatness of the switched gmC N-path bandpass filter 1000 may not be greatly changed either, according to the transfer characteristic represented in the final output signal Sig_out.

However, even though the feedforward negative Gm 1120 and the main Gm 1130 are connected in parallel, as the gain is decreased, the quality factor of the final output signal of the switched gmC N-path bandpass filter 1000 may become worse. In order for the switched gmC N-path bandpass filter 1000 to have a wide gain control range, compensation for the transfer characteristic may be required.

For such compensation, the predistorter 1110, which is configured in the input part of the main Gm 1130 connected to the first SW cap 1031, may attenuate the input signal Sig_in in phases to correspond to the phase of the gain control by the feedforward negative Gm 1120.

The gyrator 1020, the first SW cap 1031, the second SW cap 1032, the third SW cap 1033, the at least one Zf, and the CMFB 1050, which have been described with reference to FIG. 10, may perform functions that are the same as those described with reference to FIG. 10, for the gain control unit 1100. Redundant descriptions will be omitted.

Figure 12:
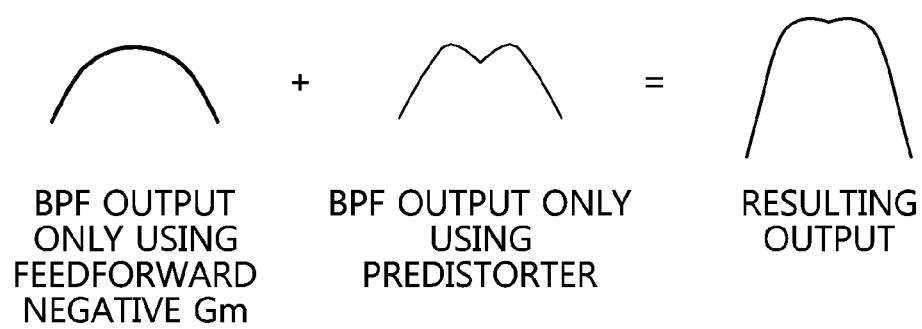
FIG. 12 describes the principle of a switched gmC N-path bandpass filter according to an embodiment, using a graph.

FIG. 12 describes the principle of the switched gmC N-path bandpass filter according to an embodiment, using a graph.

In FIG. 12, the graph on the left represents the output of the bandpass filter only using the feedforward negative Gm 1120. The graph in the middle represents the output of the bandpass filter only using the predistorter 1110. The graph on the right represents the resulting output by the combination of the predistorter 1110 and the feedforward negative Gm 1120. Here, the output of the bandpass filter may be the final signal Sig_out of the switched gmC N-path bandpass filter 1000 using the gain control unit 1100.

As illustrated in the graphs of FIGS. 7, 9, and 11, in the final signal Sig_out according to the embodiment, the out-of-band rejection ratio may be maintained constant and good pass-band flatness may be maintained. Due to these characteristics of the embodiments, the interference signals may be effectively suppressed in high-gain mode and low-gain mode. Also, among in-band signals, a wide-range signal may be processed through the wide gain control range.

As described above with reference to FIGS. 10 to 12, the switched gmC N-path bandpass filter 1000 may implement a very narrow pass-band in the Radio Frequency (RF) band. By implementing the narrow pass-band, the switched gmC N-path bandpass filter 1000 may perform the function of channel filtering, which is processed in BaseBand Analog (BBA) by a conventional analog-based receiver. Also, the switched gmC N-path bandpass filter 1000 is an integrated circuit, and may vary the band of frequencies to be passed according to the frequency of a switching clock. By varying the band of the frequencies to be passed, the switched gmC N-path bandpass filter 1000 may improve the selectivity for the narrow band channel signal over a wide band. Through the improvement in selectivity, the switched gmC N-path bandpass filter 1000 may be used to implement a high-performance receiver. Through the above-mentioned characteristic, the switched gmC N-path bandpass filter 1000 may be a solution for the difficulty caused by the existing off-chip elements, for example, the complexity for the broadband or multiband.

Figure 13:
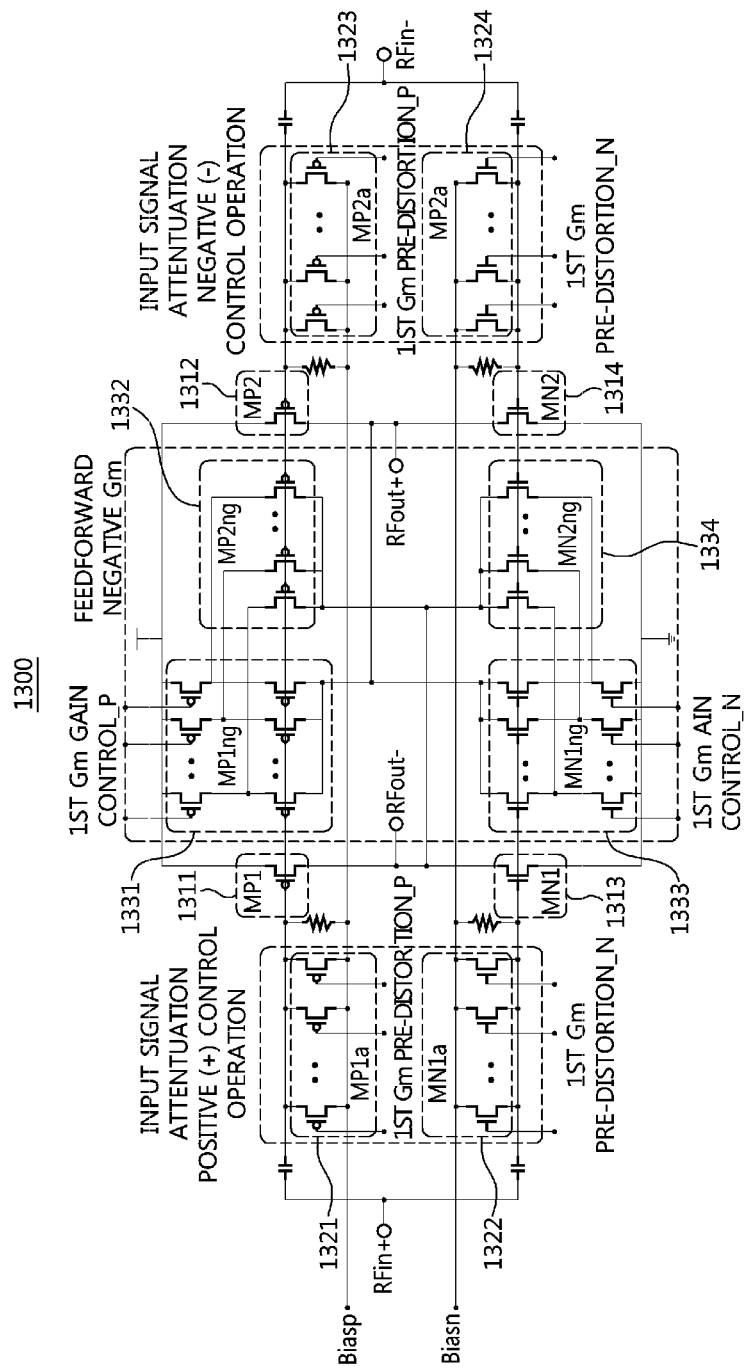
FIG. 13 is a circuit diagram of a transconductance circuit (Gm) according to an embodiment.

FIG. 13 is a circuit diagram of a Gm according to an embodiment.

The Gm 1300 illustrated in FIG. 13 may correspond to the gain control unit 500 described with reference to FIG. 5 and the gain control unit 1100 described with reference to FIG. 11.

The Gm 1300 may be used to implement the bandpass filter having a wide gain control range, described in the embodiment. The Gm 1300 may represent a circuit in which the above-described main Gm 1130 and predistorter 1110 are implemented. However, the above-described Gm 1130 and predistorter 1110 may be variously implemented, and the implementation is not limited to the Gm 1300.

The Gm 1300 may include an inverter-based Gm, a pre-distortion MOS array, and an output current driving MOS array. The pre-distortion MOS array may include a pre-distortion PMOS array and a pre-distortion NMOS array. The output current driving MOS array may include an output current driving PMOS array and an output current driving NMOS array.

The inverter-based Gm may receive an input signal Sig_in. In FIG. 13, RFin+ and RFin− are illustrated as the two respective polarities of the input signal.

The inverter-based Gm may convert the voltage of the input signal into the current of the output signal. Specifically, the inverter-based Gm may implement the function of the above-described main Gm 1130. The inverter-based Gm may have a differential structure. As the inverter-based Gm, MP1 1311 and MP2 1312, which are PMOS transistors, and MN1 1313 and MN2 1314, which are NMOS transistors, are illustrated in FIG. 13. The respective inverters of the inverter-based Gm may be connected to each other through coupling capacitors.

The pre-distortion MOS array may receive a first Gm pre-distortion_p signal and a first Gm pre-distortion_n signal. The first Gm pre-distortion_p signal and the first Gm pre-distrotion_n signal may correspond to a Pre_distortion_ctl signal described above with reference to FIG. 11.

The pre-distortion MOS array may perform gain control and differential pre-distortion according to the received first Gm pre-distortion_p signal and first Gm pre-distortion_n signal.

In FIG. 13, MP1a 1321 and MP2a 1323 are illustrated as the pre-distortion PMOS array, and MN1a 1322 and MN2a 1324 are illustrated as the pre-distortion NMOS array. The MP1a 1321 and the MN1a 1322 may correspond to the input signal attenuation positive (+) control operation, and the MP2a 1323 and the MN2a 1324 may correspond to the input signal attenuation negative (−) control operation. The pre-distortion PMOS array may be controlled by the first Gm pre-distortion_p signal, and the pre-distortion NMOS array may be controlled by the first Gm pre-distortion_n signal.

The output current driving MOS array may receive a first Gm gain control_p signal and a first Gm gain control_n signal. The first Gm gain control_p signal and the first Gm gain control_n signal may correspond to the Gain_ctl signal described above with reference to FIG. 11.

The output current driving MOS array may perform gain control according to the received first Gm gain control_p signal and first Gm gain control_n signal. The output current driving MOS array may receive differential voltage as an input signal, and may drive current, having a polarity reverse to that of the differential voltage, as an output signal. In FIG. 13, RFout− and RFout+ are illustrated as the output signals. For example, RFout− and RFout+ may be the two respective polarities of the output signal.

In FIG. 13, MP1ng 1331 and MP2ng 1332 are illustrated as the output current driving PMOS array, and MN1ng 1333 and MN2ng 1334 are illustrated as the output current driving NMOS array. MP1ng 1331, MP2ng 1332, MN1ng 1333, and MN2ng 1334 may correspond to the feedforward negative Gm. The output current driving PMOS array may be controlled by the first Gm gain control_p signal, and the output current driving NMOS array may be controlled by the first Gm gain control_n signal.

Also, the Gm 1300 may further include a bias-related circuit and a control switch circuit related to the bias-related circuit. In FIG. 13, Biasp and Biasn are illustrated as a bias signal.

A bandpass filter that provides gain control for a wide input signal amplitude range is provided.

A transmitter and receiver that provide gain control for a wide input signal amplitude range are provided.

Provided is a bandpass filter that maintains the transfer characteristic of the filter while providing gain control.

Provided is a bandpass filter that enables gain control for a wide input signal amplitude range while maintaining performance characteristics, such as an out-of-band attenuation ratio capable of high linearity and good pass-band flatness.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. For example, even if the described techniques are performed in a different order, the described components such as systems, architectures, devices, circuits, are combined or coupled with other components by a method different from the described methods, or the described components are replaced with other components or equivalents, the results are still to be understood as falling within the scope of the present invention.

Therefore, other implementations, embodiments, and modifications equivalent to the claims are included in the scope of the claims set forth below.

What is claimed is:

1. A switched N-path bandpass filter, comprising:
   a bandpass filter including a first switched capacitor that filters an input signal, the bandpass filter generating an output signal based on the filtered input signal; and
   a gain control unit receiving the input signal and performing gain control and pre-distortion, the gain control unit performing the gain control between a voltage of the input signal and a current of the output signal of the bandpass filter, the pre-distortion being performed on the input signal in accordance with a transfer characteristic of the bandpass filter.

2. The switched N-path bandpass filter of claim 1, wherein the transfer characteristic comprises at least one of a flatness factor of the bandpass filter and a Q factor of the bandpass filter.

3. The switched N-path bandpass filter of claim 1, wherein the gain control unit comprises a predistorter performing the pre-distortion by compensating for a decrease in a quality factor according to the gain control of the gain control unit.

4. The switched N-path bandpass filter of claim 3, wherein the gain control unit further comprises:
   a main transconductance circuit (Gm), an input terminal of the main Gm being coupled to a first terminal of the first switching capacitor; and
   a feedforward negative Gm, an input terminal of the feedforward negative Gm being coupled to the first terminal of the first switching capacitor, and
   wherein a first output of the main Gm is connected to a first output of the feedforward negative Gm, a second output of the main Gm is connected to a second output of the feedforward negative Gm, and the feedforward negative Gm performs the gain control by outputting a signal having a polarity reverse to a signal output by the main Gm.

5. The switched N-path bandpass filter of claim 1, wherein the bandpass filter further includes a second switched capacitor and a third switched capacitor, the second and third switched capacitors filtering the input signal and extending a bandwidth of the signal filtered by the first switched capacitor.

6. The switched N-path bandpass filter of claim 4, further comprising:
   a gyrator connecting the gain control unit, the second switched capacitor, and the third switched capacitor to each other,
   wherein a negative Gm improving a Q factor of the switched N-path bandpass filter is attached to the gyrator.

7. The switched N-path bandpass filter of claim 1, further comprising:
   a common mode feedback circuit connected to two output terminals of the bandpass filter, the output signal being output by the two output terminals of the bandpass filter.

8. The switched N-path bandpass filter of claim 1, further comprising:
   at least one negative feedback impedance element correcting the transfer characteristic of the bandpass filter, the at least one negative feedback impedance element being coupled between the first switching capacitor and two output terminals of the bandpass filter, the output signal being output by the two output terminals of the bandpass filter.

9. The switched N-path bandpass filter of claim 1, wherein the gain control unit comprises:
   an inverter-based Gm converting the voltage of the input signal to the current of the output signal;
   a pre-distortion MOS array receiving the input signal and performing the gain control and the differential pre-distortion; and
   an output current driving MOS array receiving the input signal and driving a signal having a polarity reverse to that of the input signal.

* * * * *